US006641746B2

(12) United States Patent
Houge et al.

(10) Patent No.: US 6,641,746 B2
(45) Date of Patent: Nov. 4, 2003

(54) CONTROL OF SEMICONDUCTOR PROCESSING

(75) Inventors: Erik Cho Houge, Orlando, FL (US); John Martin McIntosh, Orlando, FL (US); Edward Alios Rietman, Nashua, NH (US)

(73) Assignee: Agere Systems, Inc., Allentown, PA (US)

( * ) Notice: Subject to any disclaimer, the term of this patent is extended or adjusted under 35 U.S.C. 154(b) by 57 days.

(21) Appl. No.: 09/967,435

(22) Filed: Sep. 28, 2001

(65) Prior Publication Data

US 2003/0062339 A1 Apr. 3, 2003

(51) Int. Cl.⁷ .............................. H01L 21/00; B44C 1/22
(52) U.S. Cl. ...................... 216/59; 156/345.24; 216/41; 216/67; 438/9; 438/710
(58) Field of Search ................................ 438/8, 9, 710; 216/41, 59–61, 67, 84, 85, 86; 156/345.24–345.25

(56) References Cited

U.S. PATENT DOCUMENTS

| | | | |
|---|---|---|---|
| 5,474,647 A | * 12/1995 | Poultney et al. | 156/345.24 |
| 5,494,697 A | 2/1996 | Blayo et al. | |
| 5,653,894 A | 8/1997 | Ibbotson et al. | |
| 5,737,496 A | 4/1998 | Frye et al. | |
| 6,258,169 B1 | * 7/2001 | Asano | 156/345.24 |

OTHER PUBLICATIONS

Rietman, Edward A. A Production Demonstration of Wafer–toWafer Plasma Gate Etch Control by Adaptive Real–Time Computation of the Over–Etch Time From in Situ Process Signals. IEEE Transactions on Semiconductor Manufacturing, vol. 8, No. 3, Aug. 1995, pp. 304–308.

Ruegsegger, Steven, et al. Feedforward Control for Reduced Run–to–Run Variation in Microelectronics Manufacturing. IEEE Transactions on Semiconductor Manufacturing, vol. 12, No. 4, Nov. 1999, pp. 493–502.

* cited by examiner

Primary Examiner—William A. Powell
(74) Attorney, Agent, or Firm—David G. Maire; Beusse Brownlee Bowdoin & Wolter, P.A.

(57) ABSTRACT

An integrated metrology and lithography/etch system and method (10) for micro-electronics device manufacturing. A process control neural network (30) is used to develop an estimated process control parameter (32) for controlling an etching process (28). The process control neural network is responsive to a multi-parameter characterization of a patterned resist feature MPC(PR) (16) developed on a substrate. The process control parameter is used as a feedforward control for the etching process to develop an actual final mask feature. A multi-parameter characterization of the actual final mask feature MPC(HM) (36) is used as an input to a training neural network (40) for mapping to an ideal process control parameter. The ideal process control parameter is compared to the estimated control parameter to develop an error parameter (46), which is then used to train the process control neural network.

12 Claims, 3 Drawing Sheets

CONTROL OF SEMICONDUCTOR PROCESSING

The present invention relates generally to the field of semiconductors, and more specifically to the feed-forward control of a semiconductor manufacturing process.

BACKGROUND OF THE INVENTION

Imaging processes for the production of micro-electronic devices on semiconductor substrates are well known in the art. Such processes generally involve the creation of a patterned layer of material for selectively exposing or protecting areas of a semiconductor substrate during a subsequent additive or subtractive process.

Photoresist compositions are widely used to form the patterned layer of material on a semiconductor substrate. A thin layer of photoresist material is first deposited on the substrate, then exposed to a controlled pattern of radiation to cause a chemical reaction in the exposed areas. Visible light, ultraviolet radiation, electron beam or X-ray energy may be used as the developing energy depending upon the photoresist material selected. The photoresist layer is then contacted with a developer solution to dissolve and to remove either the radiation exposed areas or the radiation shielded areas, depending upon the chemistry used for a particular application. If the exposed area becomes less soluble in the developer solution, the pattern remaining on the substrate is a negative image of the pattern of radiation, therefore being referred to as a negative working photoresist. If the exposed area becomes more soluble in the developer solution, the pattern remaining on the substrate is a positive image of the pattern of radiation, therefore being referred to as a positive working photoresist. In either case, a desired portion of the underlying substrate is uncovered and exposed to subsequent processing steps, while the covered portion of the underlying substrate is protected from such subsequent processing steps.

The size of semiconductor devices continues to decrease and the metrology used to measure such devices is responding accordingly. There are many types of both optical and electron based metrology tools available. As the size of devices has decreased, optical metrology for critical dimensions has been abandoned. The scanning electron microscope (SEM) currently plays a major role for metrology in the semiconductor manufacturing industry. Modem 157 nm lithography technology pushes the limits of top down critical dimension scanning electron microscopes (CDSEM). The technology critical dimension nodes of 120 nm and 100 nm lithography will require more precision and accuracy than the SEM appears to be able to provide.

Multiple parameter characterization (MPC) refers to the use of functions or groups of measurements where a singular discrete measurement can no longer effectively represent the data. MPC is being developed in many different forms for application to scanning electron microscope data in an attempt to address the shortcomings of single parameter characterization. It is known to process the output of a scanning electron microscope to generate an amplitude modulated waveform $P(x)$ representing the intensity of reflected energy across the plane of a substrate surface. The shape and scale of the amplitude modulated waveform can be described through multiple parameters. FIG. 1 illustrates an amplitude modulated waveform $P(x)$ as may be derived by scanning a substrate having a trench feature. The waveform of FIG. 1 is divided into two portions. The distance between the left and right regions of the waveform in solid lines defines a width measurement W and the distance between the left and right regions of the waveform in dashed lines defines a line space measurement S. At discrete intervals along the height of these regions a measurement may be taken for the width and line space, then plotted as a function of height, as shown in FIG. 2. Curve $W_N$–$S_N$ may represent the MPC of a normal morphology. Curve $W_A$–$S_A$ may represent the MPC of an abnormal morphology. The use of multiple parameter characterization facilitates the use of SEM data to distinguish between such normal and an abnormal morphologies.

Current micro-electronics manufacturing methods incorporate metrology for the purpose of downstream quality control. For example, once a photoresist process has been completed, it is known to utilize a scanning electron microscope or other metrology technique to measure how closely the photoresist mask corresponds to its intended configuration. A go/no-go parameter may be established, and semiconductor wafers having photoresist patterns that are outside of the acceptance limits are removed from the production line for subsequent rework. Wafers having acceptable photoresist masks are then processed through a further manufacturing step, such as for example, an etching process. A second metrology step may then be used to confirm that the resulting hard mask product falls within predetermined acceptance limits.

In spite of the numerous advances in micro-electronics manufacturing techniques, there remain many aspects of various processes that are not fully understood by those skilled in the art. The control of many micro-electronics manufacturing techniques includes a significant amount of uncertainty. Plasma etch processes are generally difficult to control, with variations occurring from wafer to wafer and from lot to lot. Uncertainties may be induced by machine aging and cleaning lead times, run-to-run variations in wafer attributes, and chemistry of the plasma. Quality control is essentially a feed-back process, i.e. the output product is measured to determine if it is acceptable, and if it is unacceptable, a control parameter is changed. The output product is then again measured to see if the desired corrective effect has been achieved. This cycle is repeated until an acceptable output product is achieved. Each step in the manufacturing process is controlled in a similar manner. For example, to achieve a desired etch pattern, there must first be a photoresist development step then an etching step. Current quality control processes involve a first metrology step on the developed photoresist pattern, then a second metrology step on the etched wafer surface. Each of these steps are treated separately, and each has its own range of acceptable variation from the ideal design value. Because these processes are both complicated and not fully understood, there has been no effort in the industry to integrate the quality control aspects of the overall manufacturing process. Such a control scheme is naturally rigid, allows for the build-up of unfavorable tolerances, and provides no capacity for accommodating deficiencies in one process with counterbalancing variations in another process.

It is known to apply a neural network to the control of a semiconductor wafer etching process. Both U.S. Pat. No. 5,653,894 issued to Ibbotson, et al., and U.S. Pat. No. 5,737,496 issued to Frye, et al, describe the use of neural networks to control the endpoint in a plasma etch process. While such systems provide a degree of in-process control for an etch process, further improvements are desired.

BRIEF SUMMARY OF THE INVENTION

Thus there is a particular need for a system of process control that provides improved flexibility in the control of complex and sometimes poorly understood manufacturing processes such as are utilized for the micro-electronics industry.

Accordingly, a method of processing a semiconductor wafer is described herein as including: forming a layer on a surface of a semiconductor wafer; obtaining dimensional information describing a first feature on the layer; developing a multiple parameter characterization of the first feature from the first feature dimensional information; and providing the multiple parameter characterization of the first feature as an input to a process control neural network to identify a first process control parameter useful for controlling a process to develop a design feature having predetermined dimensions from the first feature. The method may further include: using the first process control parameter while applying the process to the semiconductor wafer to develop an actual feature from the first feature; obtaining dimensional information describing the actual feature; developing a multiple parameter characterization of the actual feature from the actual feature dimensional information; providing the multiple parameter characterization of the actual feature as an input to a training neural network to identify a second process control parameter useful for controlling the process to develop the actual feature from the first feature; comparing the first process control parameter and the second process control parameter to develop an error parameter; and using the error parameter to train at least one of the process control neural network and the training neural network. The method may further include: providing a quality control neural network to define a mapping between the multiple parameter characterization of the first feature and a representation of goodness of a lithography process used to produce the first feature; and using the quality control neural network as a filter for deciding if a semiconductor wafer should be processed through an etching process to develop the design feature.

In a further embodiment, a method of controlling a semiconductor device manufacturing process is described as using a process control neural network to map a relationship between a multiple parameter characterization of the topography of an in-process feature and a process control parameter value useful to control a process for developing a design feature having a predetermined topography from the in-process feature. The method may further include: using a training neural network to map a relationship between a feature topography resulting from the process and the process control parameter used to control the process; controlling the process with an actual process control parameter value output from the process control neural network to develop an actual feature topography from an actual in-process feature topography; developing a multi parameter characterization of the topography of the actual feature topography; applying the training neural network to the multi parameter characterization of the actual feature topography to define an ideal process control parameter value; comparing the ideal process control parameter value and the actual process control parameter to identify an error parameter; and using the error parameter to train the process control neural network.

A system for semiconductor device manufacturing is described herein as including: a metrology element for developing a multiple parameter characterization describing an in-process feature on a semiconductor substrate; a process control neural network having the in-process feature multiple parameter characterization as an input and having an estimated process control parameter value as an output; and a processing element having the estimated process control parameter value as an input for performing a process on the semiconductor substrate to develop a final feature on the semiconductor substrate. The system may further include: a metrology element for developing a multiple parameter characterization describing the final feature; a training neural network having the final feature multiple parameter characterization as an input and having an ideal process control parameter value as an output; and a comparator having the estimated process control parameter value and the ideal process control parameter value as inputs and having an error parameter as an output. At least one of the process control neural network and the training neural network may have the error parameter as an input. The system may further include a quality control neural network having the in-process feature multiple parameter characterization as an input and having a quality indicator as an output.

In a further embodiment, a system for control of a semiconductor manufacturing operation is described as including: a process control neural network having as an input a characterization of a semiconductor wafer feature prior to processing and having as an output a control parameter value for controlling a manufacturing process, the process control neural network adapted find a mapping from the pre-processing characterization to an estimated control parameter value predicted to achieve a design semiconductor wafer feature after processing; a training neural network having as an input a characterization of an actual semiconductor wafer feature after processing through the manufacturing process controlled by the estimated control parameter and having as an output an ideal control parameter value for achieving the actual semiconductor wafer feature; and a comparator for comparing the estimated control parameter value and the ideal control parameter value to generate an error parameter. The system may further include an algorithm for training at least one of the process control neural network and the training neural network, the algorithm having the error parameter as an input.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
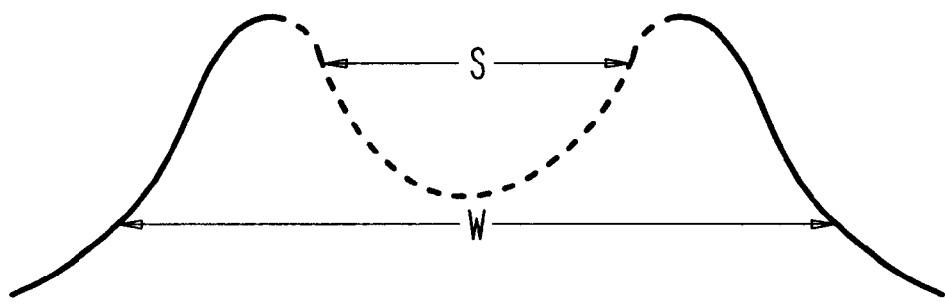
FIG. 1 is a prior art amplitude modulated waveform P(x) divided into two portions illustrating a width measurement W and a line space measurement S.
Figure 2:
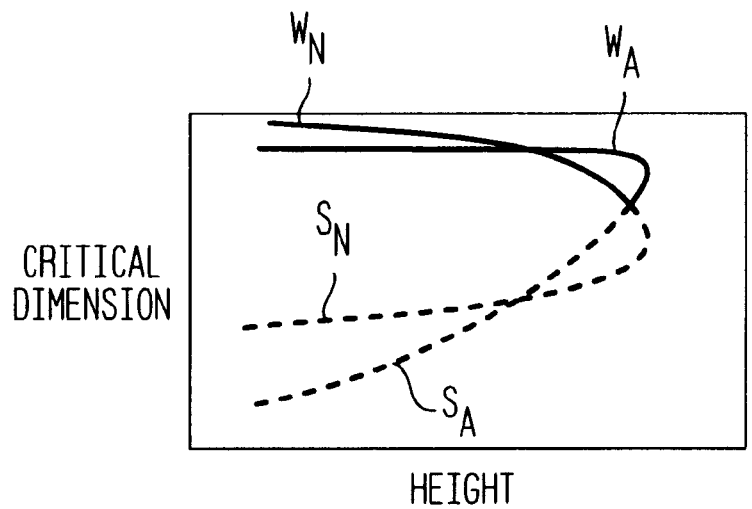
FIG. 2 is a prior art multiple parameter characterization (MPC) of amplitude modulated waveform data for both normal and abnormal photoresist line morphologies.
Figure 3:
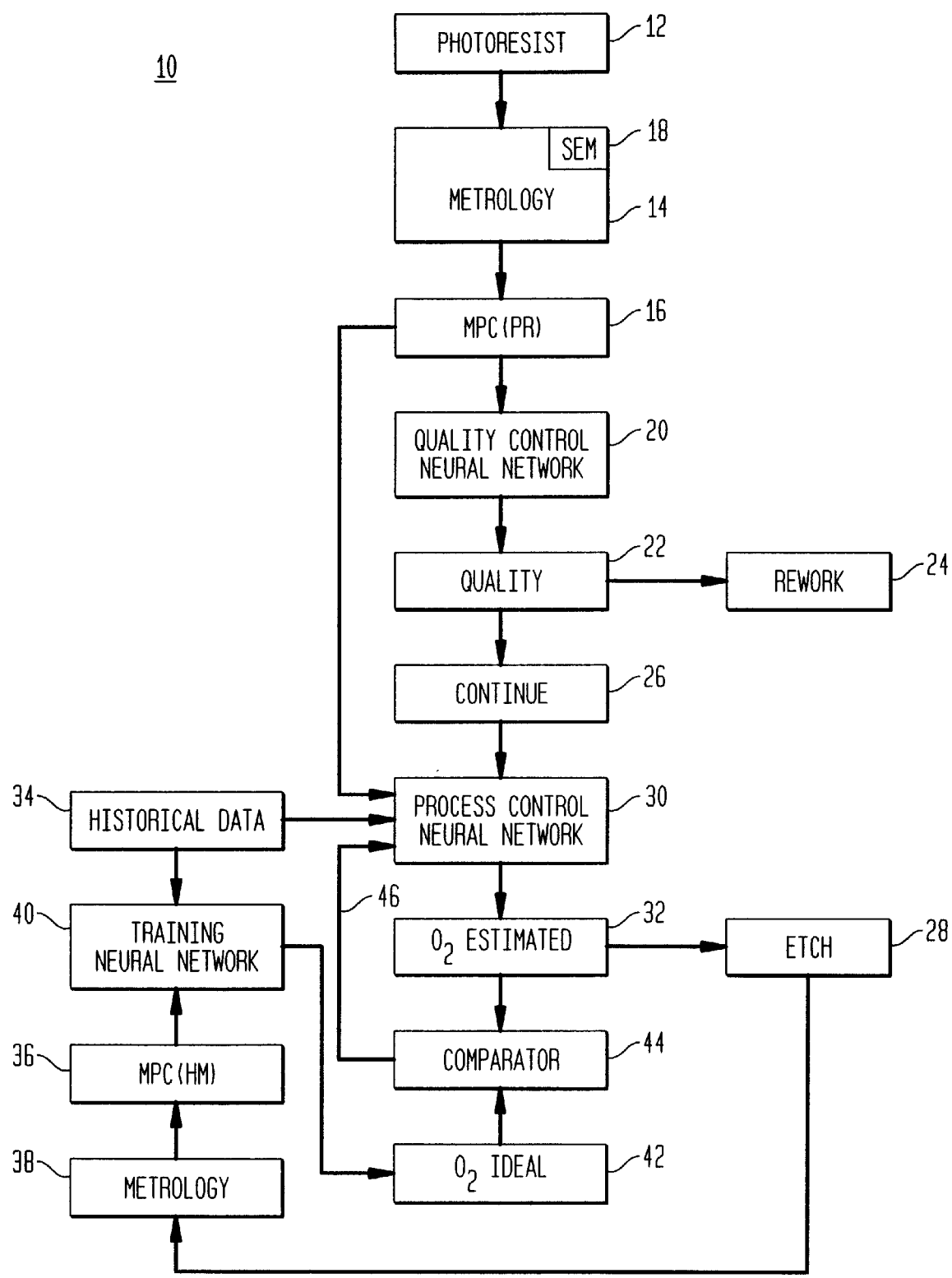
FIG. 3 is a block diagram illustration of a system for feed-forward control of an etch process utilizing separate neural networks to provide two control variable outputs which are then compared to develop an error parameter, with the error parameter then being used as an input for training the respective neural networks.

FIG. 3 illustrates a system 10 that may be used to implement a method for controlling a micro-electronic device fabrication process. The system provides feedforward in-line control of a feature profile during an etching process based upon the measured features of a photoresist pattern. This system integrates the functions of photolithography and metrology to provide improved control over a device fabrication process that may not be fully understood. As a result, the system can produce an acceptable end product from a range of input morphologies that is broader than can otherwise be accommodated with prior art feedback systems. The system accomplishes this result by utilizing neural networks to predict a process without the necessity for fully understanding that process. The system is trainable, and the results obtained from the system and method will improve with continued use.

FIG. 3 illustrates the application of a system and method for controlling the oxygen flow rate during a reactive ion etching process. This discussion is provided for illustration only, and does not limit the application of this invention to other control parameters, such as etch time, RF power, etc. Similarly, the method described herein may be applied directly to other processes, such as an ashing-etch process.

A semiconductor wafer is first processed through a photolithography element 12 to form a patterned layer of resist material on the semiconductor wafer surface. The photolithography element 12 may be any known resist development system or method. The wafer is then processed through a metrology element 14 to measure the geometry and quality of the developed photoresist pattern. The metrology element 14 may be any known apparatus or technique, and may preferably include developing a multiple parameter characterization of a photoresist feature MPC(PR) 16 from top-down scanning electron microscope (SEM) 18 inspection data. Other known types of metrology elements include optical and electron based measuring tools, scanning probe microscopy (SPM), atomic force microscope (AFM), stylus nanoprofilometer (SNP), etc. In the embodiment of FIG. 3, the MPC(PR) 16 is provided as an input to a neural network 20, referred to herein as a quality control neural network. The quality control neural network 20 is trained by either self-organization or by supervised learning to provide an output 22 indicative of the goodness of the photoresist process. The output may be a binary representation of rework 24/continue processing 26 or it may include several categories of goodness of the photoresist. This initial quality check of the photoresist need not be processed through a quality control neural network, but alternatively may utilize the output of any known go/no-go filtering procedure.

Figure 4:
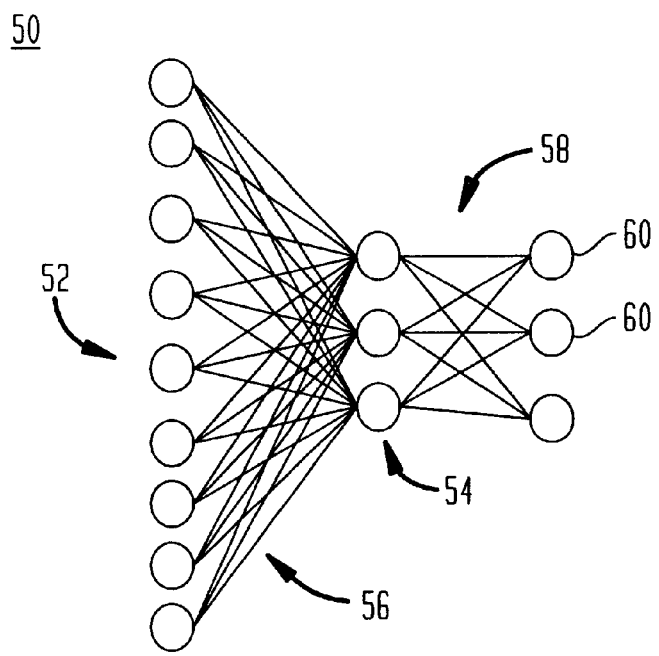
FIG. 4 is a schematic representation of a self-organized network.

Quality control neural network 20 may be trained by any method known in the art, including by a self-organized learning algorithm of the type described in Kohonen, T., *Self-organization and Associative Memory*, Springer-Verlag, Berlin (1984). The Kohonen algorithm is just one of many self-organization algorithms (also known as competitive learning) that have been reviewed by Ballard, D. H. (1997), *An Introduction to Natural Computation*, MIT Press, Cambridge, Mass. and by Hassoun, M. H. (1995), *Fundamentals of Artificial Neural Networks*, MIT Press, Cambridge, Mass. A self-organized network 50 having input nodes 52 is illustrated in FIG. 4 and may be trained as follows. Assume the input vector is the MPC(PR) image. Let this vector be represented by the symbol M and let the output from the classification nodes 54 be represented by the symbol Y, and W will represent the connection matrix 56 between the input 52 and the classification nodes 54. The value for any given element in the Y vector is given by:

$$y_j = f\left(\sum_i W_{ij} x_i\right) \quad [1]$$

If one starts with small positive random numbers in the connection matrix W, then each classifier node will produce the same output value for the same input vector. The function f could be a simple logistic function, for example:

$$f(z) = \frac{1}{(1 + \exp(-z))} \quad [2]$$

With this algorithm one of the output vector elements will have a greater value than the others (e.g. $y_1 < y_2$ $y_1 < y_3$ $y_2 > y_3$). One may exploit the differences between the individual output vector elements for computational purposes by increasing or decreasing their values. In the example described, the second element is the largest value or the winner. But it is not necessary to determine explicitly which value is the largest or which is the smallest. One may simply use the following algorithm to update the weights between the input nodes and the classification nodes.

$$W_{ij}(t+1) = W_{ij}(t) + \delta W_{ij} x_i \quad [3]$$

The advantage of this algorithm is that there is no need to explicitly examine the classifier output. To determine if the network self-organization has converged, one may simply monitor the magnitude of the changes taking place in the connection matrix 56.

After training the network, one may find that the actual outputs for the classifier nodes are not as strong as preferred, but that they are differentiated from each other. It is possible to further enhance this difference by using a winner-take-all network 58 on the back-end of the self-organizing classifier. This can be done by using simple "If" statements to select the largest output, or by a MAX(y) function to arrive at output nodes 60. At this stage, the system 10 of FIG. 3 will provide a goodness class from the network and this represents the quality of the MPC(PR) image.

Wafers passing this initial go/no-go filtering step will then be processed through an etching element 28, for example any known plasma etch system or process. The MPC(PR) 16 is provided as an input to another neural network 30 together with the continue processing output 26 of neural network 20. This neural network 30 is referred to herein as the process control neural network. Process control neural network 30 is trained by supervised learning and may be provided with historical process data 34 for the etching element. The etching element is selected to provide a target final mask pattern known from the device design. A hard mask process will be described, but one skilled in the art will recognize that the invention is not thus limited but may be applied from photoresist to any final pattern independent of whether the final is a hard mask, oxide or metal. Process control neural network 30 is designed to find a mapping from MPC(PR) 16 to the estimated oxygen flow rate 32 useful to achieve that target hard mask pattern from the as-formed photoresist pattern. A neural network is advantageously used to define the relationship between the MPC(PR)16 and the estimated oxygen flow rate 32 since the amount of data available regarding the relationship between these two variables may be limited, and the level of understanding of that relationship may also be limited. As experience is added to the historical database 34 by the processing of wafers through system 10, the precision of this mapping operation will improve.

The estimated oxygen flow rate 32 output from process control neural network 30 is utilized as a feed-forward control system input parameter for controlling the etching element 28 during the subsequent etching process performed on the wafer. Once the etching process has been completed, additional metrology information is acquired to record the shape and scale of the hard mask actually produced, and a multiple parameter characterization of the hard mask MPC (HM) 36 is generated. The metrology element 38 used for this inspection may be the metrology element 14 used to obtain the MPC(PR) or a different system. The MPC(HM) 36 is provided as an input for another neural network 40, which is also trained by supervised learning using DOE type data from empirical experiments and/or the historical data 34 from manufacturing databases. Neural network 40 is referred to herein as a training neural network. Training neural network 40 is used to find a mapping from MPC(HM) 36 to an ideal oxygen flow rate 42 that would be expected to produce such a hard mask pattern. This network may itself be trained from a series of computer simulations from running neural network 40. Training network 40 learns the mapping MPC(HM)⇒O$_2$ (ideal) and process control network 30 learns the map MPC(PR)⇒O$_2$ (estimated). The values of O$_2$ (estimated) and O$_2$ (ideal) are provided as inputs to comparator 44 which is programmed to identify an error parameter 46. If the process is completely understood and never changing, the error parameter 46 will be zero. In the real world, however, the error parameter 46 has a value and is provided via a connection for training the process control neural network 30. In essence, process control neural network 30 will have imbedded in its connections the target results for the hard mask etch. As additional data is accumulated, training neural network 40 is used to keep the connections in process control neural network 30 updated as the process changes, thereby helping neural network 30 adapt to real-world changes.

Figure 5:
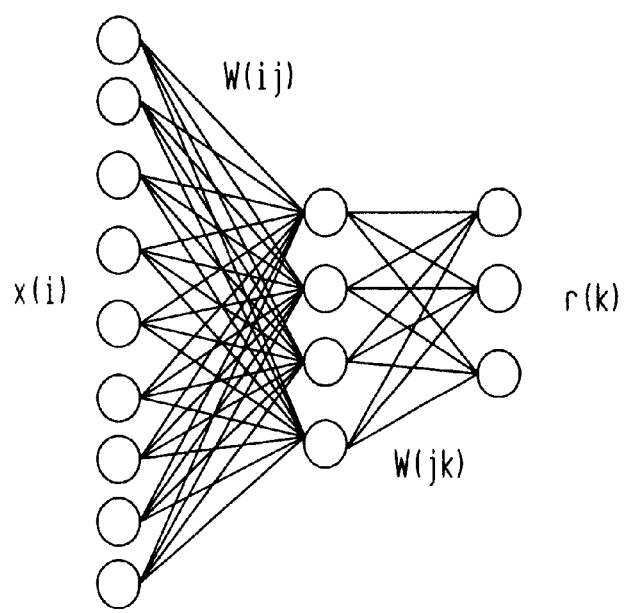
FIG. 5 is a schematic representation of a supervised neural network architecture.

There may be and preferably are similarities in training the quality control neural network 20 and the process control neural network 30. A supervised learning algorithm known as the back-propagation of errors can train both. This algorithm is well known in the art with many published papers describing it and its applications. Two published sources for the algorithm are Hassoun, M. H., *Fundamentals of Artificial Neural Networks*, MIT Press, Cambridge, Mass. (1995) and Reed, R. D. and Marks, II, R. J., *Neural Smithing—Supervised Learning in Feedforward Artificial Neural Networks*, MIT Press, Cambridge (1999). The following is a brief description of the training algorithm and how it may be applied to the present invention, as illustrated in FIG. 5.

The output of a neural network, r, is given by $$r_k = \sum_j \left[ W_{jk} \cdot \tanh\left(\sum_i W_{ij} \cdot x_i\right) \right]. \qquad [4]$$

This equation states that the i$^{th}$ element of the input vector x is multiplied by the connection weights W$_{ij}$. This product is then the argument for a hyperbolic tangent function, which results in another vector. The resulting vector is multiplied by another set of connection weights W$_{jk}$. The subscript i spans the input space. The subscripts spans the space of "hidden nodes", and the subscript k spans the output space. The connection weights are elements of matrices, and are found by gradient search of the error space with respect to the matrix elements. The cost function for the minimization of the output response error is given by:

$$C = \left[ \sum_j (t - r)^2 \right]^{\frac{1}{2}} + \gamma \|W\|^2 \qquad [5]$$

The first term represents the RMS error between the target t and the response r. The second term is a constraint that minimizes the magnitude of the connection weights, W. If (called the regularization coefficient) is large, it will force the weights to take on small magnitude values. This can cause the output response to have a low variance, and the model to take on a linear behavior. With this weight constraint, the cost function will try to minimize the error and force this error to the best optimal between all the training examples. The effect is to strongly bias the network. The coefficient thus acts as an adjustable parameter for the desired degree of the non-linearity in the model.

In order to apply this technique to training the training neural network 40, we use the MPC(HM) results as the input vector X and the oxygen flow rate as the output target value T. The network 40 is then trained using this well known algorithm. After the network is trained, it is used as a model of the expected performance of the process to train another neural network, the process control neural network 30. In this case the input vector is the MPC(PR) and the output target is the oxygen value, based upon the set of historical data 34. The objective of network 30 is to compute the oxygen flow rate for running a plasma reactor. The input to the neural network 30 is the MPC(PR), and the network 30 will model the process of mapping the MPC(PR) to the oxygen flow rate. The estimated oxygen flow rate is a value O$_e$ and the oxygen flow rate from the training network 40 is the ideal O$_i$. Since we want the process control network to compute the flow rate for actually controlling the plasma reactor, it is desired to minimize the difference between these two networks by finding:

$$\min(O_i - O_e) \qquad [6]$$

This minimum is used in the standard back-propagation algorithm to train the network.

Accordingly, in the described embodiment the quality control neural network 20 is trained with an unsupervised algorithm. This network is trained to compute the goodness of the lithography process and it uses the MPC(PR) as its input data for this computation. The next network to be trained must be the training neural network 40. This network is trained to compute the oxygen flow rate from the MPC (HM). This network 40 is essentially an inverse process model of the actual process. It is referred to as an inverse model because the actual process has MPC(PR) as its output and the oxygen flow rate as the input, recognizing that the actual output of the process is semiconductor wafers. However, the wafers are measured after processing and this performance metric is the MPC(PR). After the training network 40 is trained, the process control neural network 30 may be trained. In the real world, the input to the process is the wafers with a photoresist and an oxygen flow rate. This photoresist has a certain structure characterized by the information-rich MPC(PR). Thus, the network 30 becomes a feed-forward controller for the plasma process with its output being the oxygen flow rate. The input to the controller is the performance metric from the previous lithography processing step, where that performance metric is the MPC (PR).

Accordingly, system 10 may be used for on-line automation of a semiconductor manufacturing process allowing for the selection of a control parameter value that will move a measured photoresist geometry toward a target hard mask acceptance range. Such feed-forward control applies information acquired through in-process metrology to a downstream manufacturing step via a neural network having as an input a multiple parameter characterization of the input device morphology. This integrated photolithography-metrology-etch process can adapt to changes in variables that may not be adequately monitored or whose impact may not be fully appreciated to adjust the process in response to the input profile and the desired after-etch profile.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

We claim as our invention:

1. A method of processing a semiconductor wafer, the method comprising:
   forming a layer on a surface of a semiconductor wafer;
   obtaining dimensional information describing a first feature on the layer;
   developing a multiple parameter characterization of the first feature from the first feature dimensional information; and
   providing the multiple parameter characterization of the first feature as an input to a process control neural network to identify a first process control parameter useful for controlling a process to develop a design feature from the first feature.

2. The method of claim 1, further comprising:
   using the first process control parameter while applying the process to the semiconductor wafer to develop an actual feature from the first feature;
   obtaining dimensional information describing the actual feature;
   developing a multiple parameter characterization of the actual feature from the actual feature dimensional information;
   providing the multiple parameter characterization of the actual feature as an input to a training neural network to identify a second process control parameter useful for controlling the process to develop the actual feature from the first feature;
   comparing the first process control parameter and the second process control parameter to develop an error parameter; and
   using the error parameter to train at least one of the process control neural network and the training neural network.

3. The method of claim 1, further comprising:
   providing a quality control neural network to define a mapping between the multiple parameter characterization of the first feature and a representation of goodness of a lithography process used to produce the first feature; and
   using the quality control neural network as a filter for deciding if a semiconductor wafer should be processed through an etching process to develop the design feature.

4. A method of controlling a semiconductor device manufacturing process comprising using a process control neural network to map a relationship between a multiple parameter characterization of the topography of an in-process feature and a process control parameter value useful to control a process for developing a design feature from the in-process feature.

5. The method of claim 4, further comprising:
   using a training neural network to map a relationship between a feature topography resulting from the process and the process control parameter used to control the process;
   controlling the process with an actual process control parameter value output from the process control neural network to develop an actual feature topography from an actual in-process feature topography;
   developing a multi parameter characterization of the topography of the actual feature topography;
   applying the training neural network to the multi parameter characterization of the actual feature topography to define an ideal process control parameter value;
   comparing the ideal process control parameter value and the actual process control parameter to identify an error parameter; and
   using the error parameter to train the process control neural network.

6. The method of claim 5, further comprising:
   providing a quality control neural network to define a mapping between a multiple parameter characterization of the actual in-process feature topography and a representation of the goodness of a process used to produce the actual in-process feature; and
   using the quality control neural network as a filter for deciding if a semiconductor wafer should be processed through the process.

7. A system for semiconductor device manufacturing comprising:
   a metrology element for developing a multiple parameter characterization describing an in-process feature on a semiconductor substrate;
   a process control neural network having the in-process feature multiple parameter characterization as an input and having an estimated process control parameter value as an output; and
   a processing element having the estimated process control parameter value as an input for performing a process on the semiconductor substrate to develop a final feature on the semiconductor substrate.

8. The system of claim 7, further comprising:
   a metrology element for developing a multiple parameter characterization describing the final feature;
   a training neural network having the final feature multiple parameter characterization as an input and having an ideal process control parameter value as an output; and
   a comparator having the estimated process control parameter value and the ideal process control parameter value as inputs and having an error parameter as an output.

9. The system of claim 8, further comprising at least one of the process control neural network and the training neural network having the error parameter as an input.

10. The system of claim 7, further comprising a quality control neural network having the in-process feature multiple parameter characterization as an input and having a quality indicator as an output.

11. A system for control of a semiconductor manufacturing operation, the system comprising:
   a process control neural network having as an input a characterization of a semiconductor wafer feature prior to processing and having as an output a control parameter value for controlling a manufacturing process, the process control neural network adapted find a mapping from the pre-processing characterization to an estimated control parameter value predicted to achieve a design semiconductor wafer feature after processing;

a training neural network having as an input a characterization of an actual semiconductor wafer feature after processing through the manufacturing process controlled by the estimated control parameter and having as an output an ideal control parameter value for achieving the actual semiconductor wafer feature; and a comparator for comparing the estimated control parameter value and the ideal control parameter value to generate an error parameter.

12. The system of claim 11, further comprising an algorithm for training at least one of the process control neural network and the training neural network, the algorithm having the error parameter as an input.

* * * * *